(12) United States Patent
van Lammeren

(10) Patent No.: US 8,648,602 B2
(45) Date of Patent: Feb. 11, 2014

(54) BATTERY IMPEDANCE DETECTION SYSTEM, APPARATUS AND METHOD

(75) Inventor: Johannes Petrus Maria van Lammeren, Beuningen (NL)

(73) Assignee: NXP B.V., Eindhoven (NL)

( * ) Notice: Subject to any disclaimer, the term of this patent is extended or adjusted under 35 U.S.C. 154(b) by 436 days.

(21) Appl. No.: 13/150,983

(22) Filed: Jun. 1, 2011

(65) Prior Publication Data
US 2012/0306504 A1 Dec. 6, 2012

(51) Int. Cl.
*G01N 27/416* (2006.01)

(52) U.S. Cl.
USPC .......................... 324/430; 324/426

(58) Field of Classification Search
USPC ................................. 324/430, 426
See application file for complete search history.

(56) References Cited

U.S. PATENT DOCUMENTS

2005/0218915 A1* 10/2005 Tinnemeyer .................. 324/709

* cited by examiner

*Primary Examiner* — Arleen M Vazquez
*Assistant Examiner* — Alesa Allgood

(57) ABSTRACT

Various aspects of the present disclosure are directed to monitoring battery cells. In accordance with various embodiments, an energy storage cell apparatus includes a current injection circuit that separately inject current into individual ones of a plurality of battery cells that store energy, and an impedance-detection circuit detects an impedance characteristic of each of the plurality of battery cells in response to the injected current. A filter circuit receives impedance data regarding the detected impedance characteristic and separates low-frequency components of the impedance data from high-frequency components of the impedance data. A memory circuit stores data corresponding to high-bandwidth data including both the low-frequency components and the high-frequency components, and an access circuit provides the low-frequency components for the plurality of battery cells to a battery pack controller. The access circuit further accesses and provides the stored high-bandwidth data for a subset of the individual battery cells to the battery pack controller based upon available bandwidth for communicating the high-bandwidth data.

20 Claims, 2 Drawing Sheets

BATTERY IMPEDANCE DETECTION SYSTEM, APPARATUS AND METHOD

Figure 1:
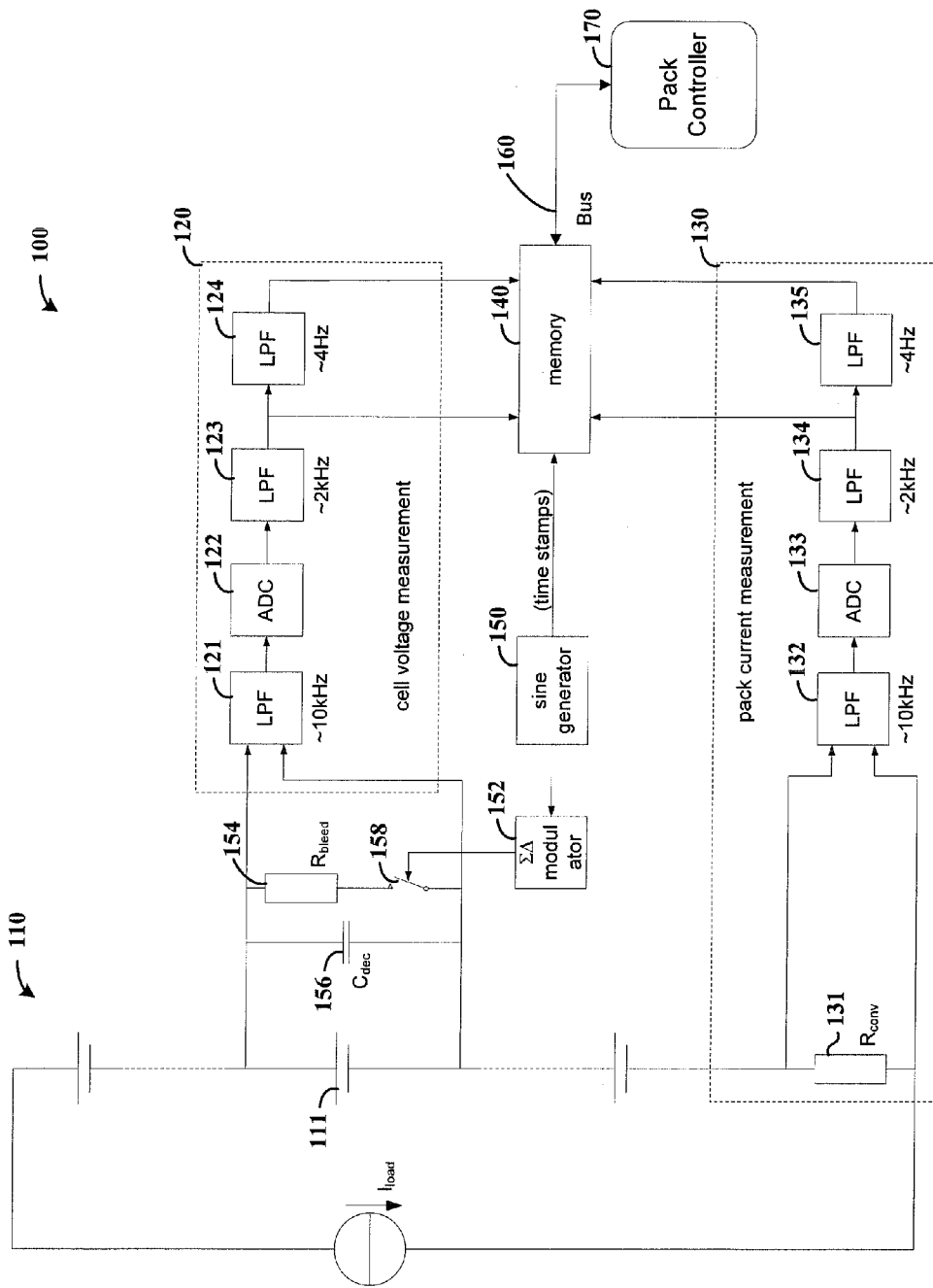

In many rechargeable battery applications, such as used in battery systems for hybrid/electric vehicles, large numbers of series-connected batteries are used to generate a high voltage that can be used to drive components such as an automotive motor. In such systems, it is important to understand the SoH (State of Health) and the SoC (State of Charge) of the series-connected batteries (e.g., a battery pack).

One manner in which to estimate or determine the SoH and/or SoC involves using the impedance of the battery cell(s), in which the impedance of the cell(s) (and the way it changes over time) can be used to accurately determine these characteristics. While the SoC is not generally derived directly from the impedance, but knowledge of the SoH can help to improve SoC estimation, particularly as the cells get older and have gone through more charge/discharge cycles. Understanding the SoH and/or SoC also makes it possible to apply desirable/optimum charge and discharge strategies that can enhance the calendar life, cycle life, and energy storage capacity of the battery pack.

Accordingly, it is useful to determine a condition of a battery cell in an accurate and reliable manner, for use in a variety of cell monitoring and control applications. For example, such information can be useful in controlling the charge of the cells and in providing an indication of an overall charge level of the battery. However, many cell condition detection approaches may require the communication and processing of a significant amount of data, which can be challenging to implement for various systems. For example, the available bandwidth in many battery applications, such as those implemented in automotive systems, can be relatively limited.

These and other matters continue to present challenges to the monitoring of battery cell characteristics.

Various example embodiments are directed to monitoring characteristics of en energy storage device, such as a battery pack used in electric vehicles.

In accordance with various example embodiments, operational characteristics of battery cells are detected, with certain data regarding the detected characteristics being stored and communicated according to an available bandwidth for communications. In particular aspects, low-frequency components of impedance data for a plurality of battery cells are separated from high-bandwidth components including the low-frequency components together with higher frequency components. The low-frequency components are communicated over a communications medium such as a data bus, together with a subset of the high-bandwidth components. The subset is selected based upon available bandwidth in the communications medium. In this context, most or all of the low-frequency components can be communicated, with a smaller subset of the high-bandwidth components communicated according to available bandwidth (and, e.g., a polling cycle or other evaluation criteria).

Various embodiments are directed to systems, devices, apparatus and methods, in accordance with the communication of battery cell impedance data.

The above discussion/overview is not intended to describe each embodiment or every implementation of the present disclosure. The figures and detailed description that follow also exemplify various embodiments.

Figure 2:
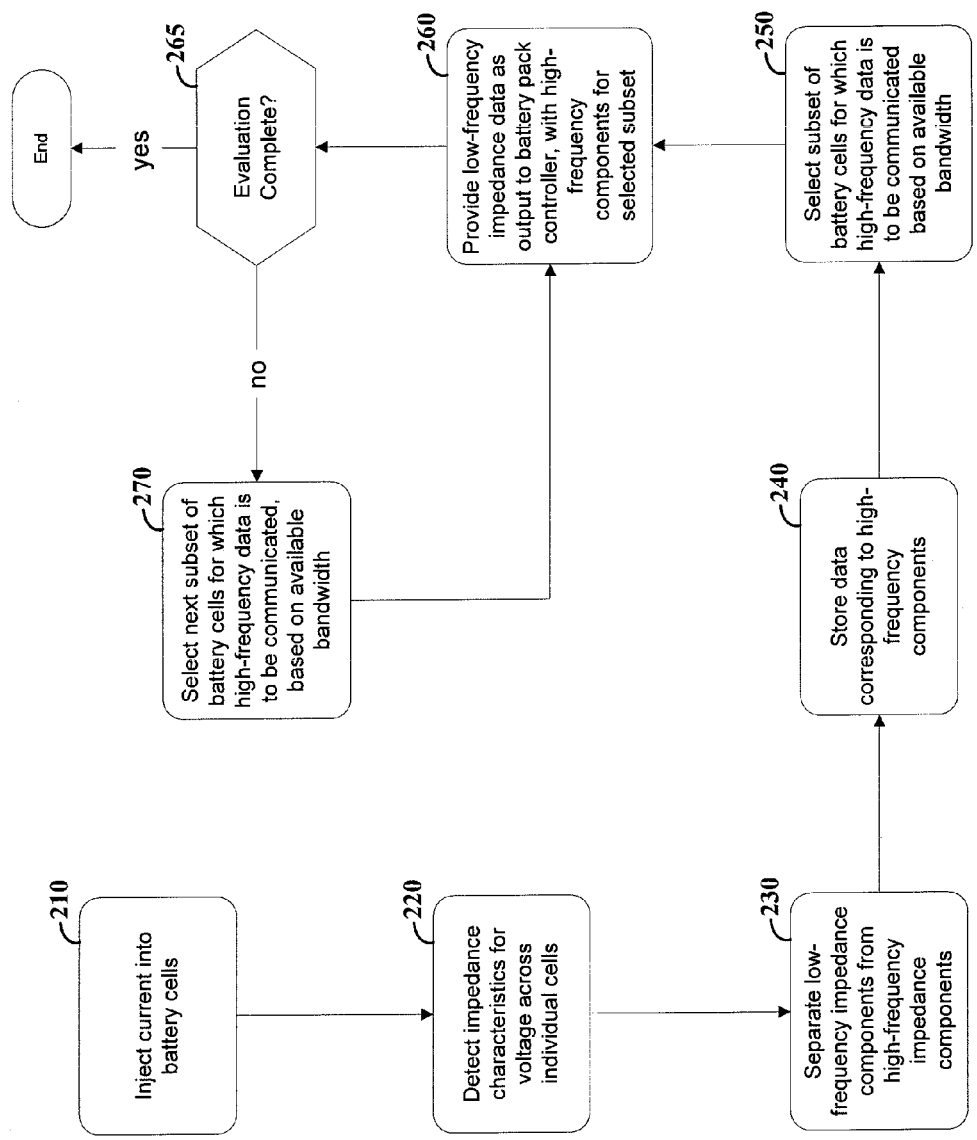

Various example embodiments may be more completely understood in consideration of the following detailed description in connection with the accompanying drawings, in which:

FIG. 1 shows a system for measuring cell characteristics of a battery pack, in accordance with an example embodiment of the present invention; and FIG. 2 shows a flow diagram for measuring cell characteristics of a battery pack, in accordance with one or more example embodiments of the present invention.

While the invention is amenable to various modifications and alternative forms, specifics thereof have been shown by way of example in the drawings and will be described in detail. It should be understood, however, that the intention is not to limit the invention to the particular embodiments described. On the contrary, the intention is to cover all modifications, equivalents, and alternatives falling within the scope of the invention including aspects defined in the claims. In addition, the term "example" as used throughout this application is only by way of illustration, and not limitation.

Aspects of the present invention are believed to be applicable to a variety of different types of devices, systems and arrangements involving batteries and/or battery control, including those involving automotive applications. While the present invention is not necessarily so limited, various aspects of the invention may be appreciated through a discussion of examples using this context.

In one or more embodiments, impedance characteristics are detected for battery cells in a battery pack having a plurality of such cells. Current is injected through cells individually (e.g., using a circuit coupled across an individual cell), with the current through and voltage across individual cells being respectively detected and used to provide the impedance characteristic. The detected impedance characteristics are filtered to generate data including low-frequency components and high-bandwidth components for the characteristics for the battery cells. The high-bandwidth components include components of higher frequency relative to the low-frequency components, and may also include the low-frequency components. The low-frequency components for all of the battery cells are provided together with a subset of the high-bandwidth components for communication over a bus (e.g., respectively for SoC and Soil determination).

Using this approach, the communication of high-bandwidth data pertaining to detected impedance characteristics can be limited to cells for which SoH is to be evaluated, reducing the amount of data communicated on the bus and/or tailoring the communications to available bandwidth on the bus. Moreover, the filtering of the low frequency components can be carried out such that enough data for SoC evaluation can be provided for all of the battery cells over available bandwidth, with the communication of higher frequency components being bandwidth-restricted. The filtering and selective provision of high-bandwidth components may be determined, set or otherwise implemented using a variety of approaches, examples of which are described in connection with various embodiments in the following discussion.

For general information regarding impedance-based determination of battery characteristics, and for specific information regarding such approaches as may be implemented in accordance with one or more example embodiments, reference may be made to U.S. Patent Publication 2005/218915A1, to F. Huet, "A review of impedance measurements for determination of State-of-Charge and State-of-Health of secondary batteries", J. Power Sources, Vol. 70, No. 1, 59-69 (January 1998), and to J. L. Jespersen et al., "Capacity measurement of Li-Ion batteries using AC impedance spectroscopy", World Electric Vehicle Journal Vol. 3, all of which are fully incorporated herein by reference.

In connection with a more particular example embodiment, an energy storage cell apparatus provides impedance data for evaluating individual battery cells. The apparatus includes a current injection circuit that separately injects current into individual ones of the plurality of battery cells, and an impedance-detection circuit that is coupled to detect an impedance characteristic of each of the plurality of battery cells, responsive to the injected current therein. A filter circuit is coupled to the impedance-detection circuit to receive impedance data regarding the detected impedance characteristic, and separates low-frequency components of the impedance data. A memory circuit stores data corresponding to the high-bandwidth components. An access circuit provides the low-frequency components for the plurality of battery cells to a battery pack controller, and provides the high-bandwidth components for a subset of the individual battery cells to the battery pack controller.

As discussed above, the selective provision of high-bandwidth components can be carried out in a number of manners, and may be controlled at the battery pack controller, at the memory, at the impedance-detection circuit or otherwise. In various example embodiments, the impedance-detection circuit detects impedance characteristics of each of the plurality of battery cells over a plurality of cycles, for which low-frequency components are communicated for most and/or all of the cycles, with a reduced set or subset of the high-bandwidth components for each cycle.

In one implementation, the memory circuit stores the high-bandwidth components for less than all of the plurality of cycles for which the low-frequency components are stored. The access circuit passes this reduced set of high-bandwidth components, while passing most or all of the low-frequency components for all cycles. In another implementation, the access circuit communicates low frequency components for all cycles as discussed above, together with high-bandwidth components for a subset of individual battery cells. In another implementation, the access circuit accesses the memory circuit to provide high-bandwidth components for different subsets of individual battery cells to the battery pack controller, respectively with the communication of the low-frequency components for different ones of the plurality of cycles. These approaches can be iteratively carried out to pass high-bandwidth data for all cells over the course of a few subsequent cycles, or by only communicating high-bandwidth data for cells for which a SoH is desirably obtained (e.g., based on detected characteristics of the cells).

In other embodiments, the high-bandwidth components are provided based upon a polling schedule, such as a fixed polling schedule or a dynamic polling schedule that may dynamically change over time (e.g., in response to detected cell characteristics). In one implementation, the access circuit accesses the memory circuit to provide the high-bandwidth components for subsets of the individual battery cells to the battery pack controller. The high-bandwidth components are provided for different subsets together with different sets of the low-frequency components, based upon a polling schedule indentifying subsets of individual battery cells for which the high-bandwidth components are to be provided. In another implementation, the memory circuit stores the high-bandwidth components by storing high-bandwidth components for less than all of the plurality of cycles, based upon a polling schedule for providing the high-bandwidth components to the battery pack controller. Accordingly, the communicated high-bandwidth components represent a reduced amount, relative to an every-cycle communication.

In another example embodiment, the current injection circuit injects current into individual battery cells using a sinusoidal current. Phase information (e.g., time stamps) for the injected current is also fed to the memory. This phase information is provided with the detected impedance characteristics for use by a battery pack controller in determining characteristics of the applied current. In certain implementations, the battery pack controller sends commands to the current injection circuit to set the frequency and amplitude of the injected current, and uses the time stamp data together with known frequency and amplitude in processing the data (e.g., thus the communication of only time stamps is adequate for providing sufficient data).

In some embodiments, high-bandwidth data is communicated over a bus as discussed above, based upon an available bandwidth of the bus and calculated bandwidth requirements for communications thereupon. In one embodiment, an access circuit determines an available bandwidth on a communications bus, and determines an amount of bandwidth required for communicating detected low-frequency components of battery cells, as discussed above. Based upon these calculations, together with other bus characteristics (e.g., reservation of bandwidth for communicating control data), an available amount of bandwidth is calculated for used in communicating high-bandwidth components (e.g., with full Nyquist bandwidth provided for each cell). A subset of high-bandwidth components (e.g., pertaining to a subset of battery cells) is thus communicated in accordance with the calculated available bandwidth.

The separate injection of current can be effected on an intermittent or cyclic basis to control the amount of current injected into each cell. In some embodiments, a current injection circuit as discussed herein separately injects current into individual ones of the plurality of battery cells by, for each battery cell, operating a switch using a modulated signal to selectively couple and decouple a balancing circuit (or other current supply) to the battery cell. The impedance-detection circuit detects an impedance characteristic of each battery cell based upon the modulated signal. Such injection can be carried out at a frequency that effects an injection of a predefined current into the battery cell for impedance measurement. Example manners in which current may be injected include coupling a resistor circuit across the battery cell to passively bleed current from the battery cell, or coupling an inductor circuit across the battery cell to actively induce current via the battery cell.

As discussed herein, various embodiments are directed to using cell balancing circuits to inject current into battery cells for impedance measurement. Such embodiments may, for example, be implemented using one or both of resistive and inductive balancing systems. Further, the various embodiments described herein as implementable with resistive systems may be implemented with other systems, such as inductive systems (e.g., using an inductive balancer that maintains bias current at nearly zero, instead of a resistive balancer that modulates the signal on a bias current).

In various implementations, balancing circuits are used to drive current through individual cells in a battery pack, with voltage/current levels held low to facilitate modelling of the battery as a linear system. The current is converted into a voltage by a resistor connected in series with the battery. Band-pass filters are used to eliminate unwanted signals (e.g., noise and distortion) before they can reach the amplitude-and-phase meters, which measure the battery voltage and the voltage across a conversion resistor. In many implementations, the meters and band-pass filters are matching (e.g., identical) to ensure matching gain and delay time in these circuits. Real and imaginary parts of the battery's impedance (Z) are determined from the amplitude and phase of the measured voltages, as follows.

$$|Z_{bat}| = \frac{V_{bat}}{V_{conv}} R_{conv}$$

$$\mathrm{Re}_{bat} = |Z_{bat}| \cdot \cos(\varphi_{bat})$$

$$\mathrm{Im}_{bat} = |Z_{bat}| \cdot \sin(\varphi_{bat})$$

In the equations above, the phase of the voltage across $R_{conv}$ is defined as zero.

The voltage/current source used for injecting n can be either under the control of a measurement system (e.g., a sine wave generator), or outside direct control of a system performing measurement (e.g., via the drive current of a traction motor of an electric car employing the battery pack). When implemented with an automobile, measurement system control can be implemented when the car is at rest, and the drive current control approach can be used when the automobile is moving. With measurement system control, battery impedance can be measured at any desired frequency at any time. Further, certain band-pass filters can be omitted in applications in which the environment in which the measurement takes place is a low noise/distortion type of environment.

Turning now to the figures, FIG. 1 shows a system 100 that measures (e.g., detects) the cell impedance of a battery pack 110, in accordance with another example embodiment. The system 100 includes cell voltage measurement components 120, and pack current measurement components 130, which may respectively form part of impedance-detection and filter circuits as discussed herein. By way of example, the cell voltage measurement components 120 are shown coupled across an individual battery cell 111, but may be implemented for individual connection across a multitude of such cells (e.g., via a multiplexing circuit), or may be duplicated for other individual battery cells in the pack 110. The impedance can be measured, for example, when the battery pack is at rest and/or when the battery pack is being charged or discharged.

The system 100 also includes a memory circuit 140 coupled to provide impedance data over a bus 160 (e.g., to pack controller 170), as well as current injection components shown coupled across the battery cell 111. The current injection components include a (co)sine generator 150 and sigma-delta modulator 152, which inject a current into an individual cell (e.g., at 111) by switching a balancer with a bleed resistor 154 and capacitor 156 on/off using switch 158 operated by a modulated signal, such as a pulse-density modulation (PDM) modulated signal. The signal is modulated to apply a desired signal frequency.

In some embodiments, the pack controller 170 sends commands to the (co)sine generator 150 to set the frequency and amplitude of the sine wave for injected current, and the (co) sine generator 150 provides phase information of the injected sine (time stamps) to the memory 140, current injected through the balancing circuit to cell 111. This time stamp information is provided from the memory for access by pack controller 170, to provide information regarding the injected sine wave to the controller (with the controller already having amplitude and frequency information for the injected current). By sending only time stamps (e.g., without amplitude and frequency data, the amount of traffic on the bus due to the injected current can be held low/minimized.

A variety of (co)sine generators can be implemented in connection with these and other embodiments. For general information regarding such generators, and for specific information regarding generators that may be implemented in connection with these embodiments, reference may be to U.S. patent application Ser. No. 13/100,652, entitled "Method to measure the impedances of battery cells in a (H)EV application," and filed on May 4, 2011, which is fully incorporated herein by reference.

Values of the components that generate the current through the cells in the system 100 can be used as inputs regarding the current, without necessarily using a current meter in the path of generated balance current. With this information and the voltage of the battery cell for which impedance is to be measured, the value of the current that the modulated balancer injects into the cell can be calculated.

The cell voltage measurement components 120 include an analogue-to-digital converter (ADC) 122 that measures cell voltage at 111, as received via an anti-alias filter 121. A low pass filter 123 filters the output of the ADC 122, for providing high-bandwidth components of the detected impedance characteristics to the memory 140. Another low pass filter 124 further filters the output of low pass filter 123, to provide low-frequency components of the detected impedance characteristics to the memory 140.

The pack current measurement components 130 include a resistor that converts the pack current into a voltage, to provide a voltage corresponding to pack current for use in characterizing an impedance characteristic of the cell being measured. An anti-alias filter 132 (e.g., a low pass filter of about 10 kHz) filters the voltage (signal) as provided at input of an ADC 133. The output of ADC 130 is coupled to series-connected low-pass filters 134 and 135, which respectively provide high-bandwidth components and low-frequency components of the impedance characteristics detected via ADC 130, as outputs to the memory circuit 140.

The memory 140 stores and provides the outputs of the low-pass filters 123, 124, 134 and 135 for access via a communications bus 160, which can be provided to pack controller 170 for SoC and/or SoH estimation. The provision of data may be implemented in active and/or passive manners, such as by pushing data to the pack controller 170, by responding to data requests by the pack controller received over the bus 160 or both (e.g., pushing low-frequency data, and sending high-bandwidth data in response to access requests). In this context, the bus 160 and one or both of the memory 140 and the pack controller 170 (or circuits integrated therewith) are part of an access circuit that provides the low-frequency components and high-bandwidth components for evaluation. Logic circuitry in this access circuit (e.g., at the memory 140 and/or the pack controller 170) controls the communication of the low-frequency and high-bandwidth components using one or more of a variety of approaches including those discussed above, which can be implemented to selectively communicate high-bandwidth components to limit the use of bandwidth on the bus 160.

For example, the high-bandwidth components can be provided for a subset of individual battery cells to the battery pack controller 170, based upon an available bandwidth for communicating the high-bandwidth subcomponents over the data bus 160. This communication may be carried out in a cyclic nature, in which low-frequency components are provided for all or most cycles, with different subsets of the high-bandwidth components provided with each cycle. For instance, considering 100 battery cells monitored over 10 cycles, low-frequency components can be communicated during each cycle, while high-bandwidth components are communicated for 10 of the 100 battery cells per cycle on a rotating basis, so that the high-bandwidth components for all 100 battery cells are provided in subsets of 10 battery cells per cycle. In certain implementations, the battery cells for which high-bandwidth data is to be communicated are selected based on a polling schedule. In other implementations, the high-bandwidth components are provided only for certain cells based upon conditions of the cells (e.g., as indicated via the low-frequency components). A combination of these approaches may also be used.

In some implementations, the system 100 includes the pack controller 170. The impedance of individual battery cells is calculated by taking the amplitude and phase of the voltage- and current measurements and dividing them. The pack controller 170 is implemented as part of the system 100, or separately in which system 100 provides an output for use by the pack controller.

The respective frequency ranges shown in FIG. 1 with regard to the low pass filters (and anti-alias filters) are exemplary, and may be modified to suit particular applications. For instance, the low pass filters 124 and 135 can be set to a frequency of impedance characteristics that is sufficient to provide an indication of a SoC of the battery cell 111, while limiting the size of data in the low-frequency components for communication over the bus 160.

In some implementations, the (co)sine wave generator 150 drives the battery cell 111 using one frequency at a time, with the memory 140 storing data corresponding to these frequencies. In other implementations, the (co)sine wave generator 150 drives the battery cell 111 using a signal with more than one frequency, which facilitates fast measurement of signals (e.g., relative to the repeating of measurements at each frequency of interest).

In some embodiments, one or both of the ADCs 122 and 133 are implemented using oversampling sigma-delta converters, which operate at low power with high linearity for measuring low frequencies. The oversampling sigma-delta converter facilitates the use of an anti-alias filter that is smaller than that used in systems with a Nyquist-rate ADC, exhibits the aforesaid low power/high linearity characteristics, and further facilitates integration with other circuitry via its size. For the one or both of the ADCs 122 and 133 implemented using sigma-delta converters, the respective low-pass filter (123 and/or 134) connected to the output of the one or both ADCs is maintained.

In certain embodiments, one or both of the low-pass filters 123 and 134 are omitted, with the outputs of the ADCs 122 and 133 being respectively connected directly to the low-pass filters 124 and 135, and to the memory circuit 140.

The modulation of injected current via the current injection components as shown in FIG. 1, or as otherwise described herein, may involve executing/following an algorithm for measuring/determining impedance via voltage and current measurements at various frequencies in the range of mHz to kHz. For one or both of resistive and inductive modulation, various embodiments are directed to effecting this modulation by driving a switch (e.g., switch 158 in FIG. 1) with a signal modulated via PWM (Pulse Width Modulation), PDM (Pulse Density Modulation) or both. Furthermore, the frequency and amplitude of the pulses can be tailored to suit the particular battery pack operation, in order to achieve a signal that is sufficient for evaluating the battery cells yet mitigate power loss. For instance, PDM can be used in fully digital systems with a clock frequency that is designed to be as low as possible to keep dissipation low, via acting on the active clock edges. In such applications, a decoupling capacitor can be used to generate a smooth sine wave.

In some embodiments, the current injected into battery cells via a balancer circuit is injected at a value that is higher than a balancing current that the balancer circuit uses, to ensure accuracy in impedance measurement. In such embodiments, the value of an external resistor used in balancing is set lower than such a resistor used for balancing. To reduce the effective balancing current, a switch is arranged in series with the resistor and driven with a relatively high frequency (e.g., ~100 kHz square wave with a fixed duty cycle) to limit the average balancing current through the resistor, and keep the dissipation and hence the temperature of the resistor within operable (e.g., safe) limits.

Impedance measurement as discussed herein may be carried out in different manners to suit particular applications. In some embodiments, and referring again to FIG. 1, frequencies of 4 Hz (e.g., sampled at 10 S/s) and lower are all passed via bus 160 for analysis at the pack controller 170, in computing a SoC for all cells/cycles. Frequencies higher than 4 Hz are selectively provided to the pack controller 170, via the bus 160, so as to limit the amount of data communicated and facilitate the calculation of SoH type characteristics at the pack controller.

The apparatus shown in FIG. 1 can be implemented in a variety of manners, such as those discussed above. The following examples characterize embodiments that may also be implemented with FIG. 1, with reference made thereto by way of example. In some implementations, the impedance detection circuits (e.g., ADCs 122/133) detect impedance over each of a plurality of cycles. The memory circuit 140 stores data corresponding to high-bandwidth components of detected impedance by, for each of the plurality of cycles, replacing data corresponding to the high-bandwidth components for at least some of the plurality of battery cells with current data corresponding to the high-bandwidth components for the at least some of the plurality of battery cells. Accordingly, access to the memory circuit 140 for high frequency components returns only those currently-stored components. By limiting the amount of stored components and/or replacing old components, the amount and/or timeliness of the high-bandwidth data can be controlled.

Various changes or modifications may be made with the system 100 to suit applications. For example, the analogue and digital filters in the current and voltage measurement paths of the system 100 can be made to match (e.g., are substantially identical), to facilitate matching/accurate outputs. As another example, the system 100 may be expanded to include circuitry for injecting current to and monitoring a multitude of battery cells in a battery pack (e.g., a section of the battery pack). In these contexts, a battery section may refer to a group of battery cells that share cell-balancing and measurement components (e.g., at 5-17V, depending on the number of cells in the section, the cell chemistry, SoC, and temperature). A module is a group of such battery sections with a combined voltage (e.g., up to 60V), and a slice is a group of series-connected modules that generate the same voltage as the total battery pack (e.g., 100V to 600V). Battery packs may include a single slice, or a group of parallel-connected slices in which the parallel connection increases the energy content and power capabilities of the battery pack, but not voltage. Current can be driven through each battery cell individually, thus mitigating power draw as may be relevant to passing current through an entire battery pack. For example, as shown by dashed lines connecting cells, a multitude of such components may be included in a battery pack and monitored accordingly. In certain embodiments, the same hardware is used to measure the impedance of several cells, such as by selectively connecting the various components as shown in FIG. 1 (e.g., the ADC/filter circuits, and (co)sine generator/modulator circuits). Moreover, in such applications, current generator and voltage measurement circuits can be implemented in a common IC, to facilitate synchronization.

The type and operation of the bus 160 can vary depending upon the implementation. In some embodiments, the bus 160 is an automotive bus such as a CAN (controller area network) bus having a data rate of about 500 kb/s. By way of example, for a battery pack having 100 cells, the outputs of the filters 124 and 135 (as 4 Hz filters) produce 14 kb/s (100 cells times 10 samples per second per cell times 14 bits per sample). When the low pass filters 123 and 134 are implemented as 2 kHz filters with 70 kb/s of data per filter, high-bandwidth data for impedance characteristics of up to seven cells can be communicated over the bus 160 at a given time. Control data and other data will also consume some bus bandwidth, so in practice the maximum number of simultaneously observable cells may be limited. In such implementations, the memory circuit 140 is configured to store the data of 100 ms (assuming a 10 Hz polling rate), or 7 kb of data per cell. Depending on the measurement frequency and the desired measurement accuracy, the pack controller 170 reads data from the desired cell(s) for a certain amount of time.

FIG. 2 shows a flow diagram for measuring cell impedance of a one or more of a plurality of cells in a battery pack, in accordance with another example embodiment. At block 210, current is separately injected into individual ones of the plurality of battery cells using, for example, a balance circuit connected across one of the cells. At block 220, impedance characteristics indicative of voltage and current through the battery cell are detected, with the voltage-based impedance characteristics being responsive to the current injected into the battery cell. At block 230, low-frequency components of the impedance data are separated from high-bandwidth impedance data including the low-frequency components and higher frequency components, and data corresponding to the high-bandwidth components is stored at block 240.

At block 250, a subset of battery cells is selected, for which high-bandwidth components are to be provided, based upon available bandwidth for communicating the high-bandwidth components. At block 260, the low-frequency components for the plurality of battery cells are provided to a battery pack controller, together with high-bandwidth components for the selected subset of the individual battery cells. If evaluation is complete at block 265, the process ends. If evaluation is incomplete at block 265, a next subset of cells is selected at block 270, based upon available bandwidth for communicating the high-bandwidth components, and the process continues again at block 260.

In this context, high frequency components can be provided for a subset of the battery cells, with low-frequency components provided for a larger set (or all of) the battery cells, to limit the amount of data communicated. The selection of a subset at block 250 can be carried out using one or more approaches as discussed herein, such as by selecting the subset based upon characteristics of the cells to be evaluated, upon a polling cycle or other condition.

Impedance measurement, as carried out in connection with one or more embodiments herein (e.g., such as those described in connection with FIGS. 1-2), may be effected in various manners. In some embodiments, impedance measurements are carried out while charging the battery pack (e.g., using predictable, replenishing power from a charging source), or under various driving conditions such as breaking or coasting with a certain motor-braking torque. The measurement can be performed with a charger that can both charge and discharge with a selectable current, as negative currents can then be measured (e.g., as implemented with what is referred to herein as a current injection circuit, where such current is negative).

In accordance with a particular embodiment, impedance measurement is carried out as follows. An impedance-detection circuit waits until current, temperature, and SoC are at a level at which a new measurement is to be carried out, such as may be determined by comparing such parameters to stored/table values. The cell(s) to be measured are selected, and spectra of voltage and pack current are retrieved from memory (e.g., as provided via the output of filters 123/134 to memory circuit 140 in FIG. 1), from impedance characteristics measured at a desired frequency or frequencies (e.g., one frequency at a time or multiple frequencies at once). The retrieved information is communicated over a bus and processed, such as by a pack controller 170. If the pack current does not contain enough signal at the desired frequency/frequencies, current is injected in the selected cell(s), such as by using a PDM-modulated balance current. While injecting current with the balancer, the spectrum of the pack current is measured. If the pack current also contains a signal at the measurement frequency, then the measurement is determined to be unreliable, its result is discarded, and the measurement is repeated. If the measurement is taken while driving, the DC level of the current is checked to ensure that it has stayed at the level at which the measurement should be taken.

In some embodiments in which pack current is not accessible and/or is in a format that cannot be used by the impedance measurement circuitry, an impedance measurement procedure is implemented as follows (e.g., as may be implemented with FIG. 1). After current, temperature, and SoC reach a level at which a new measurement is to be made, the cells to be measured are selected, and current is injected in the selected cells using a PDM modulated balance current. While injecting current with a balancer, the spectrum of the selected cells, plus the spectrum of (at least) one cell in which no current is injected are measured. If the pack current contains a signal at the measurement frequency, it is determined that this frequency is also present in the measurement of the cell(s) in which no current is injected, the impedance measurement is determined as unreliable, its result is discarded and the measurement is repeated. For each measurement, another cell is selected to check whether the spectrum is clean at the measurement frequencies. If this measurement is carried out while the battery pack is used for driving a vehicle, the DC level of the current is checked to ensure that it has stayed at the level at which the measurement should be taken (e.g., using an assumption that the temperature is unlikely to change much in the time frame of the measurement). In some implementations, the pack current measurement components 130 are omitted.

In some embodiments involving an automotive battery used for propulsion, instead of injecting a modulated current into each individual cell, the pack current is modulated by modulating the motor current with a desired frequency. The amplitude of the modulation is controlled to mitigate discomfort to automotive passengers and damage to the motor.

With respect to various cell-balancing circuits as described herein and used for current injection, various embodiments are directed to such circuits and implemented as follows. Cell-balancing circuits equalize SoCs between the series-coupled cells by balancing SoCs of the cells during use and/or charging, to prevent or mitigate over-charging or over-discharging. Passive cell-balancing circuits draw energy from a cell having a higher SoC, which is dissipated as heat though a resistive circuit. While charging, current may be also selectively routed around a cell having a higher SoC, via the resistive circuit, to avoid further charging of the cell. Passive cell-balancing circuits may also be referred to as dissipative cell-balancing circuits. Active cell-balancing circuits transfer energy from a cell having a higher SoC to a cell having a lower SoC. The transfer of energy between cells may be performed indirectly through an energy storage component such as a capacitor or an inductor. Active cell-balancing circuits may also be referred to as non-dissipative cell-balancing circuits.

Based upon the above discussion and illustrations, those skilled in the art will readily recognize that various modifications and changes may be made to the present invention without strictly following the exemplary embodiments and applications illustrated and described herein. For example, various manners of selecting high-bandwidth data for communication to a battery pack controller over a bus can be implemented, to suit the available bandwidth, particular type of bus and/or other needs of a particular battery pack or implementation thereof. In addition, various embodiments are directed to monitoring cell performance under different types of conditions. The cell impedance is monitored during the life of the cell, with different values of the parameters used to obtain useful information regarding the properties of the cell. This multi-dimensional information can be recorded and used to provide information upon which battery characteristics can be determined. This approach may facilitate, for example, the detection/determination of impedance curves corresponding to one or more of many parameters such as cell chemistry, cell temperature, DC cell current, state of charge (SoC), cell cycle life, and cell calendar age. Other variations, as discussed in connection with certain embodiments and/or shown in the figures, may also be implemented with other embodiments. Such modifications do not depart from the true spirit and scope of the present invention, including that set forth in the following claims.

What is claimed is:

1. An energy storage cell apparatus, comprising:
   a current injection circuit configured to separately inject current into individual ones of a plurality of battery cells configured to store energy;
   an impedance-detection circuit coupled to detect an impedance characteristic of each of the plurality of battery cells responsive to the injected current therein;
   a filter circuit coupled to the impedance-detection circuit and configured to
      receive high-bandwidth impedance data regarding the detected impedance characteristic from the impedance-detection circuit, and
      separate low-frequency components of the impedance data from higher-frequency components of the impedance data;
   a memory circuit configured to store data corresponding to the high-bandwidth components; and
   an access circuit configured to provide the low-frequency components for the plurality of battery cells to a battery pack controller, and to access and provide the stored high-bandwidth components for a subset of the individual battery cells to the battery pack controller based upon available bandwidth for communicating the high-bandwidth components.

2. The apparatus of claim 1, wherein
   the impedance-detection circuit is configured to detect the impedance characteristic of each of the plurality of battery cells by detecting the impedance characteristic for a plurality of cycles, and
   the access circuit is configured to
      provide the low-frequency components for the plurality of battery cells to the battery pack controller by providing the low-frequency components for each of the plurality of cycles, and
      access the memory circuit to provide the high-bandwidth components for a subset of the individual battery cells to the battery pack controller by communicating, with the low-frequency components for one of the plurality of cycles, the high-bandwidth components for the subset of individual battery cells.

3. The apparatus of claim 1, wherein
   the impedance-detection circuit is configured to detect the impedance characteristic of each of the plurality of battery cells by detecting impedance characteristics at each of a plurality of cycles, and
   the access circuit is configured to
      provide the low-frequency components for the plurality of battery cells to the battery pack controller by providing the low-frequency components for each of the plurality of cycles, and
      access the memory circuit to provide the high-bandwidth components for a subset of the individual battery cells to the battery pack controller by providing high-bandwidth components for different subsets of individual battery cells to the battery pack controller, respectively with the low-frequency components for different ones of the plurality of cycles.

4. The apparatus of claim 1, wherein
   the impedance-detection circuit is configured to detect the impedance characteristic of each of the plurality of battery cells by detecting impedance characteristics for a plurality of cycles;
   the memory circuit is configured to store the high-bandwidth components by storing high-bandwidth components for impedance characteristics for less than all of the plurality of cycles; and
   the access circuit is configured to provide the low-frequency components for the plurality of battery cells to a battery pack controller for all of the plurality of cycles, and to access the memory circuit to provide the high-bandwidth components for a subset of the individual battery cells to the battery pack controller for the less than all of the plurality of cycles.

5. The apparatus of claim 1, wherein the access circuit is configured to access the memory circuit to provide the high-bandwidth components for a subset of the individual battery cells to the battery pack controller by providing the high-bandwidth components for different subsets together with different sets of the low-frequency components based upon a polling schedule indentifying subsets of individual battery cells for which the high-bandwidth components are to be provided.

6. The apparatus of claim 1, wherein
   the impedance-detection circuit is configured to detect the impedance characteristic of each of the plurality of battery cells by detecting the impedance characteristic for a plurality of cycles, and
   the memory circuit is configured to store the high-bandwidth components by storing high-bandwidth components for less than all of the plurality of cycles based upon a polling schedule for providing the high-bandwidth components to the battery pack controller.

7. The apparatus of claim 1, wherein
   the impedance-detection circuit is configured to detect the impedance characteristic of each of the plurality of battery cells by detecting the impedance characteristic for a plurality of cycles, and
   the memory circuit is configured to store data corresponding to the high-bandwidth components by, for each of the plurality of cycles, replacing data corresponding to the high-bandwidth components for at least some of the plurality of battery cells with current data corresponding to the high-bandwidth components for the at least some of the plurality of battery cells.

8. The apparatus of claim 1, wherein the access circuit is configured to provide the high-bandwidth components for a subset of the individual battery cells to the battery pack controller based upon a polling schedule indentifying the subset of individual battery cells for which the high-bandwidth components are to be provided during different communication cycles.

9. The apparatus of claim 1, wherein the access circuit is configured to access the memory circuit to provide the high-bandwidth components for a subset of the individual battery cells to the battery pack controller in response to a command received from the battery pack controller.

10. The apparatus of claim 1, wherein the access circuit includes a circuit integrated with the battery pack controller and configured to access the memory circuit via the communications bus to access and provide the high-bandwidth components for a subset of the individual battery cells to the battery pack controller.

11. The apparatus of claim 1, wherein the access circuit includes a circuit integrated with the battery pack controller and configured to
provide the low-frequency components for the plurality of battery cells to the battery pack controller by receiving the low-frequency components over a communications bus, and
access the memory circuit via the communications bus to access and provide the high-bandwidth components for a subset of the individual battery cells to the battery pack controller.

12. The apparatus of claim 1, wherein the access circuit is integrated with the impedance-detection circuit, filter circuit and memory circuit, and configured to provide the low-frequency components for the plurality of battery cells to the battery pack controller by communicating the low-frequency components to the battery pack controller over a communications bus, and
access the memory circuit to provide the high-bandwidth components for a subset of the individual battery cells to the battery pack controller by communicating the high-bandwidth components to the battery pack controller.

13. The apparatus of claim 1, wherein the access circuit is configured to access the memory circuit to provide the high-bandwidth components for a subset of the individual battery cells to the battery pack controller by
determining an available bandwidth on a communications bus;
determining an amount of bandwidth required for communicating the low-frequency components; and
determining an amount of the high-bandwidth components to communicate on the bus based upon the determined available bandwidth and the determined amount of bandwidth required for communicating the low-frequency components.

14. The apparatus of claim 1, wherein the current injection circuit is configured to separately inject current into individual ones of the plurality of battery cells by separately coupling a cell balancing circuit across each of the plurality of battery cells to inject current therein.

15. The apparatus of claim 1, wherein
the current injection circuit is configured to separately inject sinusoidal current into individual ones of the plurality of battery cells by separately coupling a cell balancing circuit across each of the plurality of battery cells to inject current therein, using a frequency and amplitude set in response to a control input received from the battery pack controller,
the memory circuit is configured to store phase data indicative of the phase of the injected sinusoidal current, and
the access circuit is configured to access the memory circuit to provide the phase data to the battery pack controller, for injected current via which the high-bandwidth components provided to the battery pack controller are obtained.

16. A system for monitoring a battery pack having a plurality of battery cells connected in series, the system comprising:
a current injection circuit configured to separately inject current into individual ones of the plurality of battery cells;
a cell voltage detection circuit configured to provide, for each of the battery cells, impedance data including low-frequency and high-frequency components indicative of cell voltage of the battery cell, in response to the injected current;
a pack current detection circuit configured to provide impedance data including low-frequency and high-frequency components indicative of voltage on a resistor circuit that is connected in series with the battery cells, and therein providing an indication of current through the battery cells;
a memory circuit configured to store data corresponding to high-bandwidth data including both the low-frequency and high-frequency components;
a communications bus; and
a battery pack controller configured to, via the communications bus,
receive the provided low-frequency components for the plurality of battery cells from each of the cell voltage and pack current detection circuits, and
access the memory circuit to retrieve the stored high-bandwidth data for a subset of the individual battery cells, based upon available bandwidth for communicating the high-bandwidth data.

17. The system of claim 16, wherein the battery pack controller is configured to
select ones of the battery cells for evaluating high-frequency impedance components based upon an impedance characteristic of the battery cells detected via the low-frequency components received by the battery pack controller; and
access the memory circuit to retrieve the stored high-bandwidth data for a subset of the individual battery cells by retrieving the stored high-bandwidth data for the selected ones of the battery cells.

18. The system of claim 16, wherein
the memory circuit is configured to store phase data indicative of the phase of the injected current corresponding to the detected high-frequency components, and
the battery pack controller is configured to
control the current injection circuit to inject sinusoidal current into individual ones of the plurality of battery cells at a defined frequency and amplitude,
access the memory circuit to retrieve the stored phase data for the injected sinusoidal current via which the high-frequency components provided to the battery pack controller are obtained, and
use the retrieved phase data together with the defined frequency and amplitude of the injected sinusoidal current do determine a condition of the battery cells.

19. A method for monitoring a battery pack having a plurality of battery cells connected in series, the method comprising, in a battery pack circuit:
- separately injecting current into individual ones of the plurality of battery cells;
- providing, for each of the battery cells, an output indicative of cell voltage of the battery cell responsive to the current injected into the battery cell;
- providing an output indicative of current through each of the battery cells;
- separating low-frequency components of the impedance data from high-frequency components of the impedance data;
- storing high-bandwidth data corresponding to the low-frequency components and the high-frequency components;
- providing the low-frequency components for the plurality of battery cells to a battery pack controller; and
- providing the high-bandwidth data for a subset of the individual battery cells to the battery pack controller, based upon an available bandwidth for communicating the high-bandwidth data.

20. The method of claim 19, wherein
- providing the low-frequency components includes providing the low-frequency components for each of the plurality of communication cycles, and
- providing the high-bandwidth data includes providing high-frequency components for different subsets of individual battery cells to the battery pack controller, respectively with the low-frequency components for different ones of the plurality of communication cycles.

* * * * *